United States Patent
Kempen et al.

(10) Patent No.: US 9,164,403 B2
(45) Date of Patent: Oct. 20, 2015

(54) RADIATION SOURCE, LITHOGRAPHIC APPARATUS AND DEVICE MANUFACTURING METHOD

(75) Inventors: Antonius Theodorus Wilhelmus Kempen, 's-Hertogenbosch (NL); Richard Joseph Bruls, Eindhoven (NL); Erik Roelof Loopstra, Eindhoven (NL); Johannes Hubertus Josephina Moors, Helmond (NL); Gerardus Hubertus Petrus Maria Swinkels, Eindhoven (NL); Wilbert Jan Mestrom, Roermond (NL)

(73) Assignee: ASML Netherlands B.V., Veldhoven (NL)

(*) Notice: Subject to any disclaimer, the term of this patent is extended or adjusted under 35 U.S.C. 154(b) by 455 days.

(21) Appl. No.: 13/512,128

(22) PCT Filed: Dec. 8, 2010

(86) PCT No.: PCT/EP2010/069192
§ 371 (c)(1),
(2), (4) Date: May 25, 2012

(87) PCT Pub. No.: WO2011/098169
PCT Pub. Date: Aug. 18, 2011

(65) Prior Publication Data
US 2012/0295205 A1   Nov. 22, 2012

Related U.S. Application Data (60) Provisional application No. 61/302,752, filed on Feb. 9, 2010, provisional application No. 61/317,529, filed on Mar. 25, 2010.

(51) Int. Cl.
*G03F 7/20* (2006.01)
*B08B 3/08* (2006.01)

(52) U.S. Cl.
CPC .............. *G03F 7/70908* (2013.01); *B08B 3/08* (2013.01); *G03F 7/708* (2013.01); *G03F 7/70033* (2013.01); *G03F 7/70916* (2013.01); *G03F 7/70925* (2013.01)

(58) Field of Classification Search
CPC ... B08B 3/08; G03F 7/70908; G03F 7/70916; G03F 7/70925
USPC .................................................. 250/504 R
See application file for complete search history.

(56) References Cited

U.S. PATENT DOCUMENTS 7,087,914 B2 * 8/2006 Akins et al. ............... 250/504 R
7,667,820 B2   2/2010 Kempen
(Continued)

FOREIGN PATENT DOCUMENTS

EP   1 643 310 A1   4/2006
JP   2007-201460 A   8/2007
(Continued)

OTHER PUBLICATIONS

International Search Report directed to related International Patent Application No. PCT/EP2010/069192, mailed Jun. 6, 2011, from the European Patent Office; 4 pages.
(Continued)

*Primary Examiner* — Jack Berman
(74) *Attorney, Agent, or Firm* — Sterne, Kessler, Goldstein & Fox P.L.L.C (57) ABSTRACT

A radiation source generates extreme ultraviolet radiation for a lithographic apparatus as a chamber that is provided with a low pressure hydrogen environment. A trace amount of a protective compound, e.g., $H_2O$, $H_2O_2$, $O_2$, $NH_3$ or $NO_x$, is provided to the chamber to assist in maintaining a protective oxide film on metal, e.g., titanium, components in the chamber.

16 Claims, 3 Drawing Sheets

(56) References Cited

U.S. PATENT DOCUMENTS

| | | |
|---|---|---|
| 8,097,092 B2 | 1/2012 | Derra et al. |
| 2007/0166215 A1* | 7/2007 | Kempen .................. 423/235 |
| 2007/0211850 A1 | 9/2007 | Lambert et al. |

FOREIGN PATENT DOCUMENTS

| | | |
|---|---|---|
| JP | 2008-547214 A | 12/2008 |
| TW | 200606579 A | 2/2006 |
| WO | WO 2005/101122 A2 | 10/2005 |
| WO | WO 2007/107783 A1 | 9/2007 |
| WO | WO 2008/079008 A2 | 7/2008 |
| WO | WO 2009/104962 A1 | 8/2009 |
| WO | WO 2009/121641 A1 | 10/2009 |

OTHER PUBLICATIONS

International Preliminary Report on Patentability and Written Opinion of the International Searching Authority directed to related International Patent Application No. PCT/EP2010/069192, mailed Aug. 23, 2012, from the International Bureau of WIPO; 9 pages.

* cited by examiner

Fig. 7

RADIATION SOURCE, LITHOGRAPHIC APPARATUS AND DEVICE MANUFACTURING METHOD

CROSS REFERENCE TO RELATED APPLICATIONS

This application claims the benefit of U.S. provisional applications No. 61/302,752, filed on Feb. 9, 2010 and No. 61/317,529 filed on 25 Mar. 2010, which are incorporated by reference herein in their entirety.

BACKGROUND

1. Field of the Invention

The present invention relates to a radiation source, particularly for use in lithography, a lithographic apparatus and a method for manufacturing a device.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

In a typically laser produced plasma source, droplets of the fuel (e.g., tin) are radiated by a pulsed laser beam with sufficient power that they are turned into a plasma in a hydrogen atmosphere. The hydrogen atmosphere is at a relatively low pressure, e.g., 20-30 mbar, and the chamber in which the plasma is formed as well as other parts of the source apparatus can become very hot. Therefore, the various components of the source apparatus are subjected to significant physical and thermal stresses, as well as chemical attack.

SUMMARY

It is desirable to provide a laser produced plasma source that is better able to endure the stresses applied to it over a long period.

According to an embodiment of the present invention, there is provided a radiation source device constructed and arranged to supply a beam of extreme ultraviolet radiation to a lithographic apparatus. The radiation source device includes a vacuum chamber enclosing a radiation generating element, a gas supply arranged to supply hydrogen to the vacuum chamber, and a protecting device arranged to supply a trace amount of a protective compound to the vacuum chamber.

The gas supply may be arranged to supply hydrogen at a pressure of less than about 25 mbar.

According to another embodiment of the present invention, there is provided a lithographic apparatus constructed and arranged to project a patterned beam onto a substrate. The apparatus includes a vacuum chamber enclosing a component comprising a non-inert material, a gas supply arranged to supply a background gas that can react with the non-inert material to the vacuum chamber, and a protecting device arranged to supply a trace amount of a protective compound to the vacuum chamber. The protective compound rather than the background gas preferentially bonds to the non-inert material.

The component may include a droplet generator arranged to emit droplets of a fuel and a beam generating device arranged to irradiate the droplets of fuel. The droplet generator may be arranged to generate droplets of liquid tin as the fuel. The component may be a reflector, an actuator or any other component. The gas supply may be arranged to supply hydrogen at a pressure of less than about 25 mbar. The protecting device may be arranged to provide the protective compound at a rate such that the partial pressure of the protective compound in the vacuum chamber is greater than about $10^{-4}$ times and/or less than about $10^{-2}$ times the partial pressure of hydrogen in the vacuum chamber.

According to yet another embodiment of the present invention, there is provided a lithographic apparatus. The lithographic apparatus includes a vacuum chamber enclosing a radiation modifying element, a gas supply arranged to supply hydrogen to the vacuum chamber, and a protecting device arranged to supply a trace amount of a protective compound to the vacuum chamber.

The protecting device may be arranged to supply a protective compound comprising $H_2O$, $H_2O_2$, $O_2$, $NH_3$, $NO_x$, $O_3$, $CO_2$ or LOX. The radiation modifying element may include a droplet generator arranged to emit droplets of a fuel and a beam generating device arranged to irradiate the droplets of fuel. The droplet generator may be arranged to generate droplets of liquid tin as the fuel. The radiation modifying element may be a reflector. The gas supply may be arranged to supply hydrogen at a pressure of less than about 25 mbar. The protecting device may be arranged to provide the protective compound at a rate such that the partial pressure of the protective compound in the vacuum chamber is greater than about $10^{-4}$ times and/or less than about $10^{-2}$ times the partial pressure of hydrogen in the vacuum chamber. The vacuum chamber may enclose an illumination system arranged to project a radiation beam onto a patterning means and/or the vacuum chamber may enclose a projection system arranged to project an image of a patterning means onto a substrate.

According to yet again another embodiment of the present invention, there is provided a device manufacturing method using a lithographic apparatus. The method includes imparting a pattern onto a radiation beam, projecting the patterned radiation beam onto a substrate, providing hydrogen to a chamber traversed by the radiation beam, and providing a trace amount of a protective compound to the chamber.

Further embodiments, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Before describing such embodiments in more detail, however, it is instructive to present an example environment in which embodiments of the present invention may be implemented.

Figure 1:
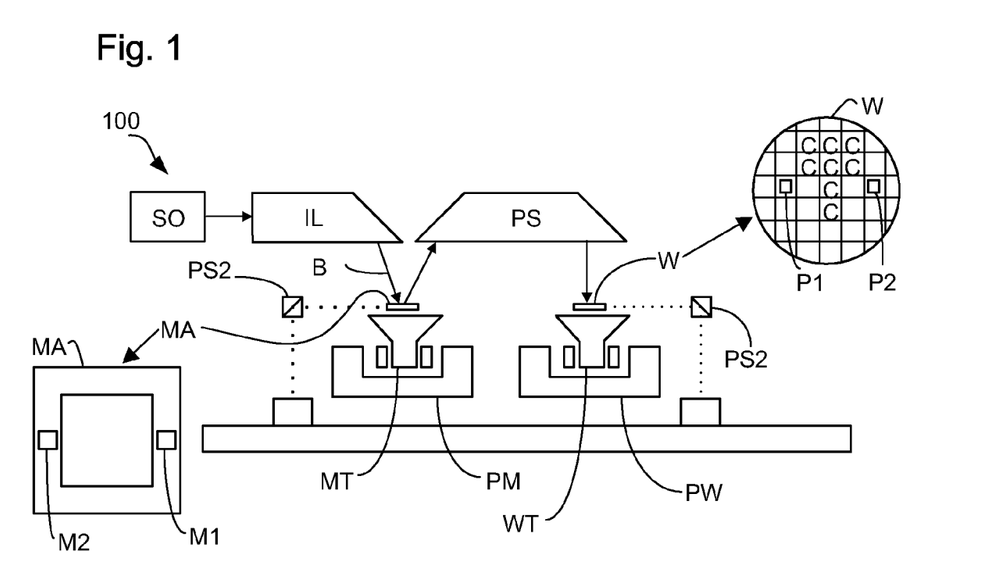
FIG. 1 depicts a lithographic apparatus, according to an embodiment of the invention.

FIG. 1 schematically depicts a lithographic apparatus 100 including a source collector module SO according to one embodiment of the invention. The apparatus comprises an illumination system (illuminator) IL configured to condition a radiation beam B (e.g., EUV radiation), a support structure (e.g., a mask table) MT constructed to support a patterning device (e.g., a mask or a reticle) MA and connected to a first positioner PM configured to accurately position the patterning device, a substrate table (e.g., a wafer table) WT constructed to hold a substrate (e.g., a resist coated wafer) W and connected to a second positioner PW configured to accurately position the substrate, and a projection system (e.g., a reflective projection system) PS configured to project a pattern imparted to the radiation beam B by patterning device MA onto a target portion C (e.g., comprising one or more dies) of the substrate W.

The illumination system may include various types of optical components for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic, or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components. It may be desired to use a vacuum for EUV radiation since other gases may absorb too much radiation. A vacuum environment may therefore be provided to the whole beam path with the aid of a vacuum wall and vacuum pumps.

In this embodiment, for example, the apparatus is of a reflective type (e.g., employing a reflective mask).

The lithographic apparatus may be of a type having two (dual stage) or more substrate tables and for example, two or more mask tables. In such "multiple stage" machines the additional tables may be used in parallel, or preparatory steps may be carried out on one or more tables while one or more other tables are being used for exposure.

Referring to FIG. 1, the illuminator IL receives an extreme ultraviolet (EUV) radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent, which are commonly referred to as σ-outer and σ-inner, respectively, of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
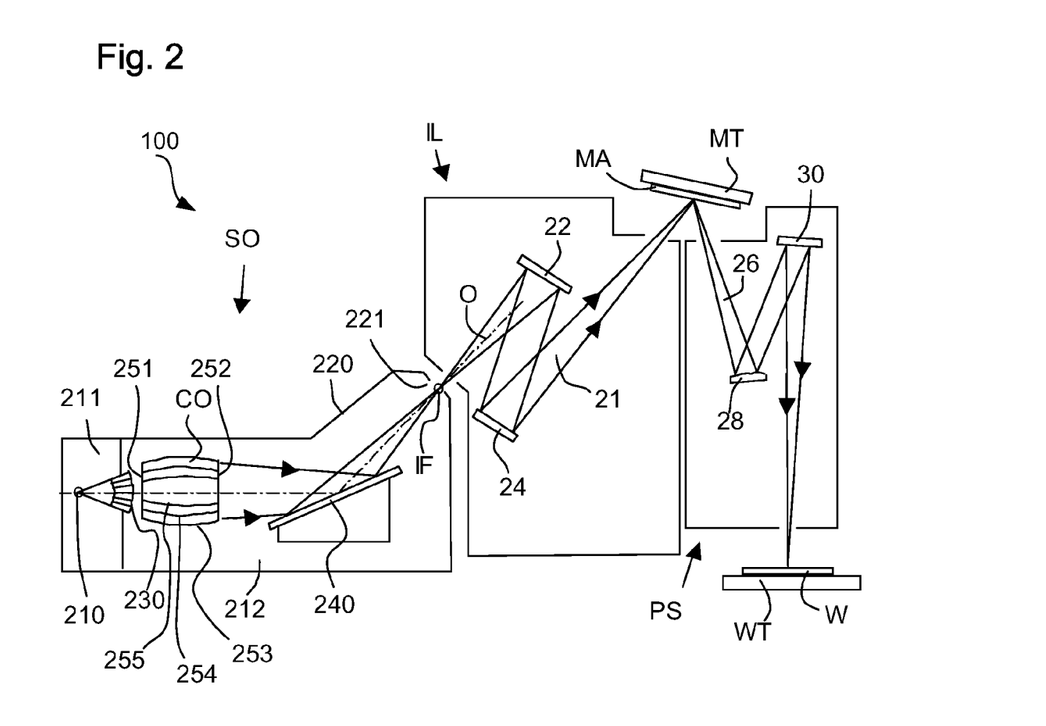
FIG. 2 is a more detailed view of the apparatus of FIG. 1.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is used in combination with a discharge produced plasma source, often called a DPP source.

Figure 3:
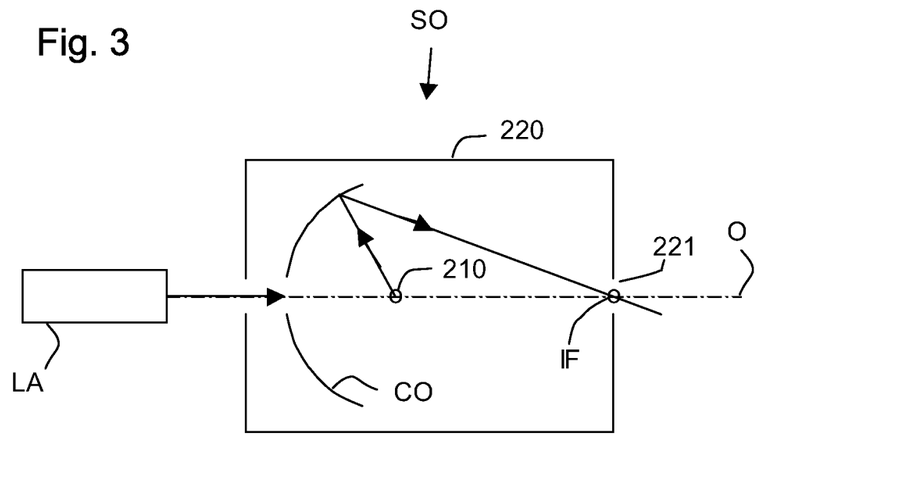
FIG. 3 is a more detailed view of the source collector module SO of the apparatus of FIGS. 1 and 2.

Alternatively, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

In one example, at the elevated temperatures normally experienced in a laser produced plasma source, titanium can be attacked by clean hydrogen gas that is used in the plasma formation chamber. Titanium can be used in the plasma chamber because it has good corrosion resistance against liquid tin and is normally protected against chemical attack by a native oxide skin. In particular, a droplet generator, that generates droplets of liquid Sn, and a droplet catcher, that catches droplets of liquid Sn and/or plasma debris, can be made of titanium. However, the present inventors have determined that in the aggressive environment of a plasma chamber, the protective oxidized skin can evaporate, dissolve or otherwise break down so that the bulk material becomes exposed to the hydrogen gas and tin plasma. Components of the source may also be made from hardened steel, which suffers from similar problems.

In one example, the titanium components of the plasma chamber can be protected by providing a small amount of moisture, (i.e., water $H_2O$) in trace amounts. The moisture may be provided in the form of water, water vapor or ice and also in the form of pure oxygen, which may react temporarily with any hydrogen present to form water. Hydrogen peroxide ($H_2O_2$), ozone ($O_3$), carbon dioxide ($CO_2$) and liquid oxygen (LOX) may also be used. The provision of such protective compounds in trace amounts also protects steel components.

Figure 4:
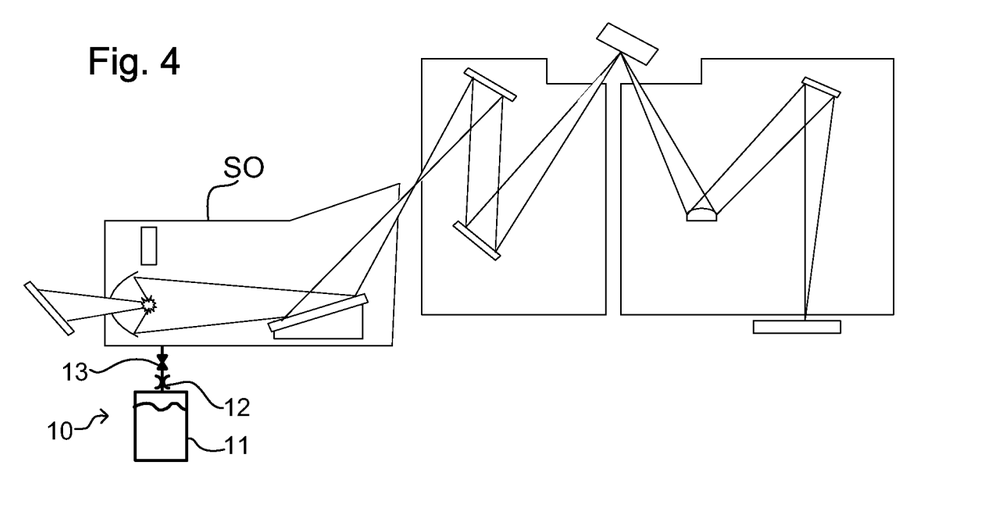
FIGS. 4, 5, and 6 depict various lithographic apparatus, according to various embodiments of the present invention.

FIG. 4 shows an embodiment of the invention in which a protecting device 10 is connected to the source module SO. The protecting device 10 comprises a tank 11 containing liquid water, a needle valve 12 to control the flow of water vapor from the tank and a shutoff valve 13 to allow the supply to be closed off when not required. In an embodiment, the needle valve contains a heater (not shown) to prevent condensation which might occur due to the pressure drop across the needle valve. When connected to a low pressure chamber, e.g., the source module SO, liquid water in tank 11 vaporizes and vapor flows through orifice 12 to the source module. In case the source module is not at a sufficiently low pressure (less than about 23 mbar) for the liquid water to vaporize at room temperature, a heater can be provided in tank 11.

Figure 5:
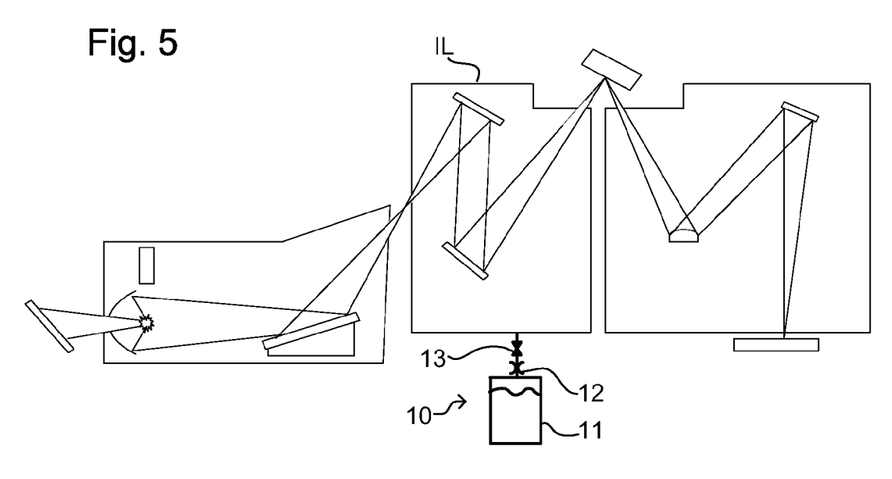
Figure 6:
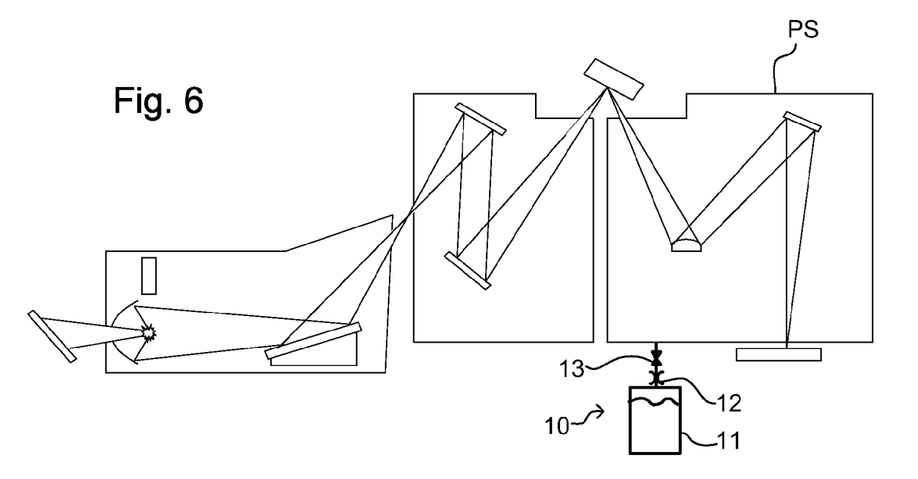

FIGS. 5 and 6 show alternative embodiments of the present invention in which the protecting device 10 is connected to the illumination system IL and projection system PS respectively in order to protect components in those modules. The protecting device of the present invention can protect components made of other materials than titanium, in particular other metals, where the bulk material is normally protected by an oxidized skin. Of course the different embodiments of the invention can be combined and a plurality of protecting devices can be provided connected to whichever modules contain components requiring protection. Alternatively, a single protecting device can be connected to several different modules of a lithographic apparatus in order to protect different components therein.

Figure 7:
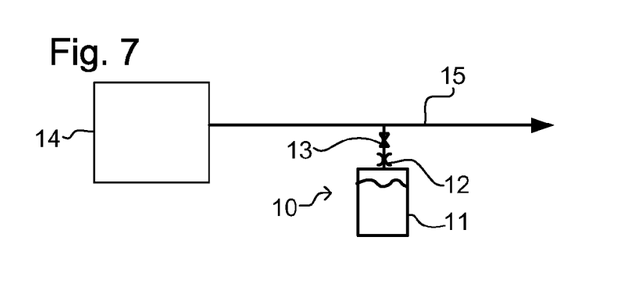
FIG. 7 depicts a gas supply apparatus, according to an embodiment of the present invention.

FIG. 7 depicts an alternative arrangement in which the protecting device 10 is connected to a gas supply line 15 which transports gas, e.g., hydrogen, from a gas supply 14 to a module of the device containing components to be protected. With this arrangement, fewer connections need be made to the evacuated chambers. In an embodiment, there is a flow of hydrogen gas in the chamber containing the component to be protected. In this case, it is desirable that the protecting device is arranged to supply the protective compound upstream of the component to be protected. In the case of the source module, the protecting device can be arranged to supply the protective compound near a droplet generator which is usually near a source of hydrogen gas. Since the droplet catcher is near an outflow from the source vacuum chamber, both droplet generator and droplet catcher can be protected at the same time.

In one example, a sufficient protective effect can be obtained if the partial pressure of $O_2$ plus half the partial pressure of $H_2O$ in the environment of the titanium component is greater than about $10^{-4}$ times the partial pressure of H in the environment. The required partial pressures of oxygen and water may vary with temperature and according to the material to be protected. The rate by which oxygen from water vapor bonds to titanium at different temperatures can be seen from Table 1 below which sets out various thermodynamic parameters for the reaction $Ti + H_2O(g) = H_2(g) + TiO$.

TABLE 1

| T C. | deltaH kJ | deltaS J/K | deltaG kJ | K |
|---|---|---|---|---|
| 0.000 | −301.074 | −54.927 | −286.071 | 5.129E+054 |
| 100.000 | −299.977 | −51.536 | −280.747 | 2.009E+039 |

TABLE 1-continued

| T C. | deltaH kJ | deltaS J/K | deltaG kJ | K |
|---|---|---|---|---|
| 200.000 | −298.632 | −48.350 | −275.755 | 2.788E+030 |
| 300.000 | −297.169 | −45.547 | −271.064 | 5.079E+024 |
| 400.000 | −295.653 | −43.110 | −266.634 | 4.918E+020 |

In this table deltaH is the change in enthalpy and deltaS is the change in entropy from which can be calculated deltaG, the change in Gibbs free energy. This enables calculation of the equilibrium constant for the reaction, K. The equilibrium constant is the ratio of the partial pressure of $H_2$ to the partial pressure of $H_2O$ at equilibrium, indicating that the oxygen present preferentially bonds to titanium rather than hydrogen by about 40 orders of magnitude. In a lithographic apparatus, the pressure in the source module can be about 1 mbar and the pressure in the illumination and projection systems can be about 0.3 mbar. Hence very small amounts of the protective compound are sufficient to effect the invention.

The inventors have also determined that at the temperatures normally occurring in the plasma chamber, tin oxide (SnO) is less stable than tin (Sn) so that the presence of the oxygen or $H_2O$ is not detrimental to the formation of the plasma. Furthermore, the stabilized oxygen layer on the titanium components can enhance their corrosion resistance against liquid tin.

In an embodiment of the invention, the component that is protected is a magnet, for example a magnet made of samarium-cobalt or neodynium. These materials are also attached by hydrogen and can be protected by an oxide layer, which is maintained by use of the protective device of the invention. The magnet may be part of an actuator, such as a motor, or a sensor.

In an embodiment of the invention, the component that is protected comprises silicon, which can react with hydrogen to form silane ($SiH_4$). This is prevented by the presence of oxygen or water provided by the protective device of the present invention. Components including silicon include multilayer reflectors such as mirrors or masks which may have an Si:Mo multilayer coating (e.g., distributed Bragg reflector). The invention is particularly advantageous when applied to protect the collector optic CO which often does not have a protective capping layer.

In an embodiment of the invention, an oxygen or moisture sensor can be provided in the chamber containing components to be protected in order to control the moisture and/or oxygen levels.

In an embodiment of the invention, traces of $NH_3$ and/or $NO_x$ are injected instead of water. Such an embodiment is useful to maintain a nitride protective layer on a bulk material, especially a metal.

In an EUV lithographic apparatus the source module, illumination system and projection system, as well as any other parts traversed by the projection beam are usually provided with a low pressure hydrogen environment because hydrogen has a low absorption coefficient to EUV radiation and also helps to clean any carbon and thin deposits off parts of the apparatus. However, other gases, such as helium, can be used instead, in which case an alternative protective compound might be appropriate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens," where the context allows, may refer to any one or combination of various types of optical components, including refractive, reflective, magnetic, electromagnetic and electrostatic optical components.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different from those of any related applications. The Applicant therefore rescinds any disclaimer of claim scope made in the application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. A radiation source comprising:
a vacuum chamber enclosing a component comprising a non-inert material and enclosing a radiation generating element comprising a fuel;
a gas supply arranged to supply hydrogen to the vacuum chamber; and
a protecting device arranged to supply a trace amount of a protective compound to the vacuum chamber,
wherein the radiation source is configured to supply a beam of extreme ultraviolet radiation to a lithographic apparatus, and
wherein a temperature inside the vacuum chamber, a first partial pressure of the protective compound in the vacuum chamber, and a second partial pressure of hydrogen in the vacuum chamber are such that the protective compound preferentially bonds to the non-inert material rather than hydrogen and are such that the fuel remains in a non-oxidized state inside the vacuum chamber.

2. The radiation source according to claim 1, wherein the protecting device is arranged to supply a protective compound selected from the group consisting of $H_2O$, $H_2O_2$, $O_2$, $NH_3$, $NO_x$, $O_3$, $CO_2$ and LOX.

3. The radiation source according to claim 1, wherein the radiation generating element comprises a droplet generator arranged to emit droplets of the fuel and a beam generating device arranged to irradiate the droplets of fuel.

4. The radiation source according to claim 3, wherein the droplet generator is arranged to generate droplets of liquid tin as the fuel.

5. The radiation source according to claim 1, wherein the protecting device is arranged to provide the protective compound at a rate such that the first partial pressure of the protective compound in the vacuum chamber is greater than about $10^{-4}$ times the second partial pressure of hydrogen in the vacuum chamber.

6. The radiation source according to claim 1, wherein the protecting device is arranged to supply the protective compound at a rate such that the first partial pressure of the protective compound in the vacuum chamber is less than about $10^{-2}$ times the second partial pressure of hydrogen in the vacuum chamber.

7. The radiation source of claim 1, wherein the radiation generating element is a discharge produced plasma (DPP) source.

8. The radiation source of claim 1, wherein the radiation generating element is arranged to produce an electrical discharge through the fuel.

9. A lithographic apparatus constructed and arranged to project a patterned beam onto a substrate, the apparatus comprising:
a vacuum chamber enclosing a fuel and a component comprising a non-inert material;
a gas supply arranged to supply a background gas that can react with the non-inert material and the fuel to the vacuum chamber; and
a protecting device arranged to supply a trace amount of a protective compound to the vacuum chamber,
wherein a temperature inside the vacuum chamber, a first partial pressure of the protective compound in the vacuum chamber, and a second partial pressure of the background gas in the vacuum chamber are such that the protective compound preferentially bonds to the non-inert material rather than the background gas and such that the fuel remains in a non-oxidized state inside the vacuum chamber.

10. The lithographic apparatus according to claim 9, wherein the gas supply is arranged to supply hydrogen and the protecting device is arranged to supply a protective compound selected from the group consisting of $H_2O$, $H_2O_2$, $O_2$, $NH_3$, $NO_x$, $O_3$, $CO_2$ and LOX.

11. The lithographic apparatus according to claim 9, wherein the non-inert material is selected from the group consisting of titanium, steel, samarium-cobalt, neodynium and silicon.

12. The lithographic apparatus according to claim 9, wherein the vacuum chamber encloses an illumination system arranged to project a radiation beam onto a patterning means.

13. The lithographic apparatus according to claim 9, wherein the vacuum chamber encloses a projection system arranged to project an image of a patterning means onto a substrate.

14. A device manufacturing method using a lithographic apparatus, the method comprising:
projecting a patterned radiation beam onto a substrate;
providing hydrogen to a vacuum chamber of the lithographic apparatus traversed by the radiation beam, the vacuum chamber including a fuel and a component comprising a non-inert material;
providing a trace amount of a protective compound to the vacuum chamber, and
setting a temperature inside the vacuum chamber, a first partial pressure of the protective compound in the vacuum chamber, and a second partial pressure of hydrogen in the vacuum chamber such that the protective compound preferentially bonds to the non-inert material rather than the background gas and such that the fuel remains in a non-oxidized state inside the vacuum chamber.

15. A lithographic apparatus, comprising:
a vacuum chamber enclosing a component comprising a non-inert material and a radiation modifying element comprising a fuel;
a gas supply arranged to supply hydrogen to the vacuum chamber; and
a protecting device arranged to supply a trace amount of a protective compound to the vacuum chamber,
wherein a temperature inside the vacuum chamber, a first partial pressure of the protective compound in the vacuum chamber, and a second partial pressure of the background gas in the vacuum chamber are such that the protective compound preferentially bonds to the chamber rather than hydrogen and are such that the fuel remains in an non-oxidized state inside the vacuum chamber.

16. A device manufacturing method using a lithographic apparatus, the method, comprising:
projecting a patterned radiation beam onto a substrate;
providing hydrogen to a chamber that encloses a radiation generating element comprising a fuel and a component comprising a non-inert material, the chamber traversed by the radiation beam;
providing a trace amount of a protective compound to the chamber; and
setting a temperature inside the chamber, a first partial pressure of the protective compound in the chamber, and a second partial pressure of hydrogen in the chamber such that the protective compound preferentially bonds to the non-inert material rather than hydrogen and such that the fuel remains in a non-oxidized state inside the chamber.

* * * * *